United States Patent
Parker et al.

(10) Patent No.: US 11,846,803 B2
(45) Date of Patent: Dec. 19, 2023

(54) ATOMIC LAYER DEPOSITION BONDING FOR HETEROGENEOUS INTEGRATION OF PHOTONICS AND ELECTRONICS

(71) Applicant: OpenLight Photonics, Inc., Goleta, CA (US)

(72) Inventors: John Parker, Goleta, CA (US); Gregory Alan Fish, Santa Barbara, CA (US); Martin A. Spannagel, San Francisco, CA (US); Antonio Labaro, Mountain View, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 0 days.

(21) Appl. No.: 17/554,342

(22) Filed: Dec. 17, 2021

(65) Prior Publication Data
US 2022/0107458 A1  Apr. 7, 2022

Related U.S. Application Data

(63) Continuation of application No. 16/844,492, filed on Apr. 9, 2020, now Pat. No. 11,237,325, which is a
(Continued)

(51) Int. Cl.
*G02B 6/12* (2006.01)
*H01L 21/12* (2006.01)
(Continued)

(52) U.S. Cl.
CPC ............. *G02B 6/122* (2013.01); *G02B 6/132* (2013.01); *G02B 6/136* (2013.01);
(Continued)

(58) Field of Classification Search
CPC .......... G02B 6/12; G02B 6/122; G02B 6/132; H01L 21/02164; H01L 21/0217; H01L 21/0228
(Continued)

(56) References Cited

U.S. PATENT DOCUMENTS 5,263,111 A * 11/1993 Nurse .................. G02B 6/2817
                                                       385/130
5,394,490 A *  2/1995 Kato  ........................ G02B 6/43
                                                       327/237
(Continued)

FOREIGN PATENT DOCUMENTS

CN       108335971 A       7/2018
CN       108335971         8/2023
(Continued)

OTHER PUBLICATIONS

"U.S. Appl. No. 15/408,725, Corrected Notice of Allowability dated Nov. 15, 2018", 8 pgs.
(Continued)

*Primary Examiner* — Kaveh C Kianni
(74) *Attorney, Agent, or Firm* — Schwegman Lundberg & Woessner, P.A.

(57) ABSTRACT

Methods and systems are presented for heterogeneous integration of photonics and electronics with atomic layer deposition (ALD) bonding. One method includes operations for forming a compound semiconductor and for depositing (e.g., via atomic layer deposition) a continuous film of a protection material (e.g., $Al_2O_3$) on a first surface of the compound semiconductor. Further, the method includes an operation for forming a silicon on insulator (SOI) wafer, with the SOI wafer comprising one or more waveguides. The method further includes bonding the compound semiconductor at the first surface to the SOI wafer to form a bonded structure and processing the bonded structure. The protection material protects the compound semiconductor from acid etchants during further processing of the bonded structure.

21 Claims, 10 Drawing Sheets

Related U.S. Application Data continuation of application No. 16/181,868, filed on Nov. 6, 2018, now Pat. No. 10,641,955, which is a continuation of application No. 15/408,725, filed on Jan. 18, 2017, now Pat. No. 10,168,475.

(51) Int. Cl.

| | | |
|---|---|---|
| *G02B 6/122* | (2006.01) | |
| *H01L 21/762* | (2006.01) | |
| *H01L 21/02* | (2006.01) | |
| *H01L 21/306* | (2006.01) | |
| *G02B 6/132* | (2006.01) | |
| *G02B 6/136* | (2006.01) | |

(52) U.S. Cl.
CPC ...... *H01L 21/0217* (2013.01); *H01L 21/0228* (2013.01); *H01L 21/02164* (2013.01); *H01L 21/02178* (2013.01); *H01L 21/02181* (2013.01); *H01L 21/02186* (2013.01); *H01L 21/02189* (2013.01); *H01L 21/30617* (2013.01); *H01L 21/76251* (2013.01)

(58) Field of Classification Search
USPC .......................................................... 385/131
See application file for complete search history.

(56) References Cited

U.S. PATENT DOCUMENTS

| | | | | |
|---|---|---|---|---|
| 5,815,615 | A * | 9/1998 | Taneya | H01S 5/026 385/50 |
| 6,282,219 | B1 * | 8/2001 | Butler | G02B 6/124 372/50.1 |
| 6,324,313 | B1 * | 11/2001 | Allman | G02B 6/125 385/36 |
| 6,500,694 | B1 | 12/2002 | Enquist | |
| 6,510,259 | B1 * | 1/2003 | Al-hemyari | G02B 26/06 385/16 |
| 6,614,947 | B1 * | 9/2003 | Al-hemyari | G02B 6/12007 385/27 |
| 6,627,531 | B2 | 9/2003 | Enquist | |
| 6,671,443 | B2 * | 12/2003 | Deliwala | G02B 6/12011 385/125 |
| 6,864,585 | B2 | 3/2005 | Enquist | |
| 6,934,455 | B2 * | 8/2005 | Skinner | G02B 6/4214 385/129 |
| 6,984,571 | B1 | 1/2006 | Enquist | |
| 7,037,755 | B2 | 5/2006 | Enquist | |
| 7,041,178 | B2 | 5/2006 | Tong et al. | |
| 7,126,212 | B2 | 10/2006 | Enquist | |
| 7,260,293 | B1 * | 8/2007 | Gunn, III | G02B 6/124 385/37 |
| 7,387,944 | B2 | 6/2008 | Tong et al. | |
| 7,807,549 | B2 | 10/2010 | Tong et al. | |
| 7,871,898 | B2 | 1/2011 | Tong et al. | |
| 8,213,751 | B1 * | 7/2012 | Ho | G02F 1/035 385/11 |
| 9,197,804 | B1 * | 11/2015 | Or-Bach | H04N 23/45 |
| 9,348,099 | B2 * | 5/2016 | Krishnamurthi | G02B 6/136 |
| 9,647,171 | B2 * | 5/2017 | Rogers | H01L 33/0093 |
| 9,864,134 | B2 * | 1/2018 | Czornomaz | H01L 27/14 |
| 10,168,475 | B2 | 1/2019 | Parker et al. | |
| 10,641,955 | B2 | 5/2020 | Parker et al. | |
| 11,237,325 | B2 | 2/2022 | Parker et al. | |
| 2002/0028045 | A1 * | 3/2002 | Yoshimura | H01L 23/5389 385/39 |
| 2002/0094663 | A1 | 7/2002 | Kwon et al. | |
| 2002/0182827 | A1 * | 12/2002 | Abe | H01L 21/76254 438/455 |
| 2003/0108269 | A1 * | 6/2003 | Pogge | G02B 6/122 385/14 |
| 2003/0113067 | A1 * | 6/2003 | Koh | G02B 6/3596 385/39 |
| 2004/0033004 | A1 * | 2/2004 | Welch | G02B 6/12023 385/14 |
| 2004/0125846 | A1 * | 7/2004 | Zediker | H01S 5/50 372/50.22 |
| 2004/0151227 | A1 * | 8/2004 | Bhowmik | H01S 5/4062 372/97 |
| 2005/0053383 | A1 * | 3/2005 | West | G02B 6/12004 398/153 |
| 2005/0054130 | A1 * | 3/2005 | Leon | G02B 6/12004 438/31 |
| 2005/0163425 | A1 * | 7/2005 | Greiner | G02B 6/124 385/37 |
| 2005/0201715 | A1 * | 9/2005 | Ellwood | G02B 6/2746 385/147 |
| 2005/0208694 | A1 * | 9/2005 | Yue | G02F 1/2257 438/31 |
| 2006/0239605 | A1 * | 10/2006 | Palen | G02B 6/423 385/33 |
| 2006/0281296 | A1 * | 12/2006 | Misra | H01L 23/5389 257/E21.705 |
| 2007/0111478 | A1 * | 5/2007 | Komura | B28D 5/0011 257/E21.599 |
| 2009/0180731 | A1 * | 7/2009 | Christensen | G02B 6/125 385/13 |
| 2009/0245298 | A1 * | 10/2009 | Sysak | B82Y 20/00 257/E33.068 |
| 2009/0303475 | A1 * | 12/2009 | Jayaraman | G02B 6/4203 438/27 |
| 2010/0032808 | A1 | 2/2010 | Ding et al. | |
| 2010/0046883 | A1 * | 2/2010 | Dangel | G02B 6/1221 385/129 |
| 2010/0111128 | A1 * | 5/2010 | Qin | H01S 5/1032 438/31 |
| 2010/0166360 | A1 * | 7/2010 | Jones | G02B 6/136 385/132 |
| 2010/0247030 | A1 * | 9/2010 | Furuyama | G02B 6/43 257/E33.076 |
| 2011/0085577 | A1 * | 4/2011 | Krasulick | H01L 25/0753 257/E33.056 |
| 2011/0123152 | A1 * | 5/2011 | Bicknell | G02B 6/125 385/36 |
| 2011/0286695 | A1 * | 11/2011 | Wu | G02B 6/42 385/14 |
| 2012/0014837 | A1 * | 1/2012 | Fehr | C12Q 1/6869 385/12 |
| 2012/0057816 | A1 * | 3/2012 | Krasulick | G02B 6/4245 257/E31.127 |
| 2012/0057822 | A1 * | 3/2012 | Wu | G02B 6/136 385/49 |
| 2012/0149148 | A1 * | 6/2012 | Dallesasse | H01L 21/78 438/107 |
| 2012/0195336 | A1 * | 8/2012 | Fang | H01S 5/028 257/E33.072 |
| 2013/0051729 | A1 * | 2/2013 | Chen | G02B 6/30 385/32 |
| 2013/0189804 | A1 * | 7/2013 | Marchena | H01L 21/76251 438/66 |
| 2013/0210214 | A1 * | 8/2013 | Dallesasse | H01L 21/8258 438/458 |
| 2013/0259077 | A1 * | 10/2013 | Ben Bakir | G02B 6/1228 372/44.01 |
| 2013/0279845 | A1 * | 10/2013 | Kobrinsky | G02B 6/136 438/31 |
| 2014/0086527 | A1 * | 3/2014 | Ban | G02B 6/4292 385/33 |
| 2014/0098833 | A1 * | 4/2014 | Kim | H01S 5/18361 372/44.011 |
| 2015/0016777 | A1 * | 1/2015 | Abovitz | G02B 27/0093 385/37 |
| 2015/0132873 | A1 | 5/2015 | Rogers et al. | |
| 2015/0212266 | A1 * | 7/2015 | Czornomaz | H01S 5/1032 438/31 |
| 2015/0226918 | A1 * | 8/2015 | Bauters | H01L 31/105 438/31 |
| 2015/0253500 | A1 * | 9/2015 | Tseng | G02B 6/136 438/31 |

(56) References Cited

U.S. PATENT DOCUMENTS

| | | | | |
|---|---|---|---|---|
| 2015/0270684 | A1* | 9/2015 | Suzuki | H01S 5/1032 372/45.01 |
| 2015/0277041 | A1* | 10/2015 | Nakagawa | H01S 5/2031 438/455 |
| 2015/0293302 | A1* | 10/2015 | Czornomaz | H01S 5/026 438/31 |
| 2015/0303653 | A1* | 10/2015 | Tanaka | H01S 5/0078 372/7 |
| 2016/0111407 | A1* | 4/2016 | Krasulick | H01L 21/8258 438/107 |
| 2016/0238795 | A1* | 8/2016 | Tan | G02F 1/3138 |
| 2016/0252692 | A1* | 9/2016 | Hofrichter | H01S 3/091 250/227.11 |
| 2016/0372387 | A1* | 12/2016 | Moffat | H01L 22/32 |
| 2017/0047312 | A1* | 2/2017 | Budd | H01L 23/585 |
| 2017/0092809 | A1* | 3/2017 | Reboud | H01L 21/823807 |
| 2017/0331248 | A1* | 11/2017 | Lambert | G02B 6/4244 |
| 2017/0351027 | A1* | 12/2017 | Reano | G02B 6/12 |
| 2018/0203188 | A1 | 7/2018 | Parker et al. | |
| 2019/0072715 | A1 | 3/2019 | Parker et al. | |
| 2020/0233148 | A1 | 7/2020 | Parker et al. | |
| 2020/0243487 | A1* | 7/2020 | Or-Bach | H01L 23/552 |

FOREIGN PATENT DOCUMENTS

| | | |
|---|---|---|
| EP | 2720327 A1 | 4/2014 |
| JP | 2012014002 | 1/2012 |
| JP | 2014525683 | 9/2014 |
| KR | 20080068281 | 7/2008 |
| KR | 20100090181 | 8/2010 |
| KR | 102510356 B1 | 3/2023 |
| SG | 10201803745 U | 12/2019 |
| TW | 201546898 A | 12/2015 |
| TW | 201947632 A | 12/2019 |
| TW | 202236692 A | 9/2022 |
| TW | I797971 | 4/2023 |

OTHER PUBLICATIONS

"U.S. Appl. No. 15/408,725, Examiner Interview Summary dated Jan. 25, 2018", 3 pgs.

"U.S. Appl. No. 15/408,725, Examiner Interview Summary dated May 30, 2018", 4 pgs.

"U.S. Appl. No. 15/408,725, Non Final Office Action dated Mar. 16, 2018", 16 pgs.

"U.S. Appl. No. 15/408,725, Notice of Allowance dated Sep. 28, 2018", 9 pgs.

"U.S. Appl. No. 15/408,725, Response filed Jan. 19, 2018 to Restriction Requirement dated Nov. 20, 2017", 8 pgs.

"U.S. Appl. No. 15/408,725, Response filed Jun. 12, 2018 to Non Final Office Action dated Mar. 16, 2018", 13 pgs.

"U.S. Appl. No. 15/408,725, Restriction Requirement dated Nov. 20, 2017", 11 pgs.

"U.S. Appl. No. 16/181,868, Final Office Action dated Sep. 30, 2019", 18 pgs.

"U.S. Appl. No. 16/181,868, Non Final Office Action dated Apr. 30, 2019", 18 pgs.

"U.S. Appl. No. 16/181,868, Notice of Allowance dated Jan. 24, 2020", 8 pgs.

"U.S. Appl. No. 16/181,868, Response filed Feb. 21, 2019 to Restriction Requirement filed Dec. 2, 2018", 5 pgs.

"U.S. Appl. No. 16/181,868, Response filed Jul. 29, 2019 to Non Final Office Action dated Apr. 30, 2019", 12 pgs.

"U.S. Appl. No. 16/181,868, Response filed Nov. 25, 2019 to Final Office Action dated Sep. 30, 2019", 11 pgs.

"U.S. Appl. No. 16/181,868, Restriction Requirement dated Dec. 21, 2018", 6 pgs.

"U.S. Appl. No. 16/844,492, Non Final Office Action dated May 11, 2021", 16 pgs.

"U.S. Appl. No. 16/844,492, Notice of Allowance dated Oct. 19, 2021", 7 pgs.

"U.S. Appl. No. 16/844,492, Response filed Mar. 19, 2021 to Restriction Requirement dated Jan. 22, 2021", 6 pgs.

"U.S. Appl. No. 16/844,492, Response filed Aug. 11, 2021 to Non Final Office Action dated May 11, 2021", 10 pgs.

"U.S. Appl. No. 16/844,492, Restriction Requirement dated Jan. 22, 2021", 7 pgs.

"European Application Serial No. 18151086.8, Communication Pursuant to Article 94(3) EPC dated Jun. 9, 2021", 7 pgs.

"European Application Serial No. 18151086.8, Extended European Search Report dated Jun. 27, 2018", 7 pgs.

"European Application Serial No. 18151086.8, Response filed Jan. 22, 2019 to Extended European Search Report dated Jun. 27, 2018", 13 pgs.

"Taiwanese Application Serial No. 107115024, Office Action dated Jun. 23, 2021", With English translation, 14 pages.

Anantha, P, et al., "Homogeneous Chip to Wafer Bonding of InP-Al2O3-Si Using UV/O3 Activation", ECS Journal of Solid State Science and Technology, 3 (4) P43-P47 (2014), (2014), P43-P47.

Fan, J, et al., "High-[kappa]Al2O3material in low temperature wafer-level bonding for 3D integration applica", AIP Advances, American Institute of Physics, 2 Huntington Quadrangle, Melville, NY 11747, val. 4, No. 3, (Jan. 1, 1901), 7 pgs.

Halioua, Y, et al., "Hybrid III-V semiconductor/silicon nanolaser", Optics Express, vol. 19, No. 10, (May 9, 2011), 9221.

Li, Xiang, et al., "Design and Analysis of 2-[mu]m InGaSb/GaSb Quantum Well Lasers Integrated Onto Silicon-on-Insulator (SOI) Waveguide Circuits Through an Al2O3 Bonding Layer", IEEE Journal of Selected Topics in Quantum Electronics, IEEE Service Center, Piscataway, NJ, US, val. 22, No. 6, (Nov. 1, 2016), 7 pgs.

"Chinese Application Serial No. 201710912337.3, Office Action dated Oct. 10, 2022", With English translation, 20 pgs.

"Taiwanese Application Serial No. 111102920, Response filed Oct. 11, 2012 to Office Action dated Jul. 12, 2022", w/ English claims, 9 pgs.

"Taiwanese Application Serial No. 111102920, Office Action dated Jul. 12, 2022", W English Translation, 4 pgs.

"Korean Application Serial No. 10-2018-0051428, Notice of Preliminary Rejection dated Jul. 8, 2022", w English Translation, 8 pgs.

"Chinese Application Serial No. 201710912337.3, Response filed Feb. 24, 2023 to Office Action dated Oct. 10, 2022", w/ English claims, 13 pgs.

"European Application Serial No. 23162640.9, Extended European Search Report dated Apr. 14, 2023", 9 pgs.

"Chinese Application Serial No. 201710912337.3, Response to Telephone Examiner Interview filed May 5, 2023", w English claims, 7 pgs.

"Korean Application Serial No. 10-2023-0031771, Notice of Preliminary Rejection dated Oct. 16, 2023", w English Translation, 4 pgs.

* cited by examiner

FIG. 1

(LAYER THICKNESS NOT TO SCALE)

FIG. 10 ously filed U.S. application Ser.

ATOMIC LAYER DEPOSITION BONDING FOR HETEROGENEOUS INTEGRATION OF PHOTONICS AND ELECTRONICS

PRIORITY

This application is a continuation of U.S. application Ser. No. 16/844,492, filed Apr. 9, 2020, which is a continuation of U.S. application Ser. No. 16/181,868, filed Nov. 6, 2018, which is a continuation of U.S. application Ser. No. 15/408,725, filed Jan. 18, 2017, which is incorporated by reference herein in its entirety.

TECHNICAL FIELD

The subject matter disclosed herein generally relates to methods and systems for semiconductor manufacturing and, more specifically, to semiconductor manufacturing that includes bonding of heterogeneous materials.

BACKGROUND

Heterogeneous bonding of two different types of materials is becoming more common in optics and electronics for manufacturing integrated circuits (IC). The combination takes advantage of using materials with specialized and different properties to be combined into a single semiconductor for processing.

For example, a silicon on insulator (SOI) wafer provides low loss waveguide routing while a III-V compound semiconductor generates light efficiently for lasers, and absorbs light efficiently for modulators and detectors used in optical communication. The combination of these materials provides an ideal platform for creating photonic integrated circuits (PICs). Since the materials are dissimilar, the bond greatly influences the yield and process limitation in making these PICs. For example, in some applications, the goal is to make a highly integrated transmitter that is completely made through wafer-level scale processing.

For hybrid Si photonics, the shear strength of the bond between the compound semiconductor to the Si substrate has a great impact of device yield. Since the materials being bonded are different, separation and delamination between the materials is a common challenge to overcome. In addition, a multitude of acids are used in the fabrication of these devices to etch the compound semiconductor after bonding. However, the acids wick underneath the compound semiconductor following the Si channels and etch the bonding interface.

BRIEF DESCRIPTION OF THE DRAWINGS

Various ones of the appended drawings merely illustrate example embodiments of the present disclosure and cannot be considered as limiting its scope.

DETAILED DESCRIPTION

Example methods and systems are directed to for heterogeneous integration of photonics and electronics with atomic layer deposition (ALD) bonding. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific in details.

The bonded structure has problems that must be addressed during manufacturing, such as the bonding shear strength and acid damage in post-bonding processing. Some solutions solve these problems by changing the bond layer of the III-V semiconductor to InGaAsP, which is more resistant to many acid etches. However, this change also reduces the shear strength and leads to delamination prior to the acid steps. Other solutions include changes to the acid etch steps, the device artwork, or the setback from the III-V edge to the III-V devices. However, these solutions do not increase the shear strength of the bonding, they add processing time and cost, and they do not fully solve the problem of acid wicking. Further, these solutions do not allow the setback from the III-V edge to the device to be reduced, thereby limiting the shrinking of the die size.

Embodiments presented herein provide solutions for bonding an SOI wafer with a compound semiconductor (e.g., a semiconductor formed on III-V materials). Embodiments provide for adding a thin layer of protection material (e.g., $Al_2O_3$) to the bonding surface in the compound semiconductor (e.g., III-V based) after growth and prior to the bonding operation. In some examples, the addition of the thin layer is performed via ALD, but other deposition methods may be utilized. The $Al_2O_3$ protects the III-V material from acid etchants after bonding and also increases the shear strength of the bond (e.g., compared to $SiO_2$). In addition, the protection material results in fewer defects, higher yields, and provides the ability to make smaller optical circuits while using less material.

One general aspect includes a method including operations for forming a compound semiconductor, depositing a continuous film of a protection material on a first surface of the compound semiconductor, and forming a SOI wafer, with the SOI wafer including one or more waveguides. The method also includes bonding the compound semiconductor at the first surface to the SOI wafer to form a bonded structure and processing the bonded structure. The protection material protects the compound semiconductor from acid etchants during the processing of the bonded structure.

One general aspect includes a bonded structure including a compound semiconductor, including a continuous film of a protection material deposited on a first surface of the compound semiconductor, and a SOI wafer. The SOI wafer includes one or more waveguides, where the compound semiconductor is bonded at the first surface to the SOI wafer to form the semiconductor structure, the bonded structure being processable to pattern circuits on the compound semiconductor. The protection material protects the compound semiconductor from acid etchants during the processing of the bonded structure.

One general aspect includes a method including operations for forming a III-V based semiconductor, depositing a continuous film of $Al_2O_3$ on a first surface of the III-V based semiconductor, singulating the III-V based semiconductor to create epi dies, and plasma cleaning the epi dies. The method further includes operations for forming a SOI wafer, with the SOI wafer including one or more waveguides, placing the first surface of the epi dies on the SOI wafer, bonding the epi dies to the SOI wafer to form a bonded structure, removing a substrate of the epi die through grind and chemical operations, and processing the bonded structure, where the $Al_2O_3$ protects the epi dies from acid etchants during the processing of the bonded structure.

Figure 1:
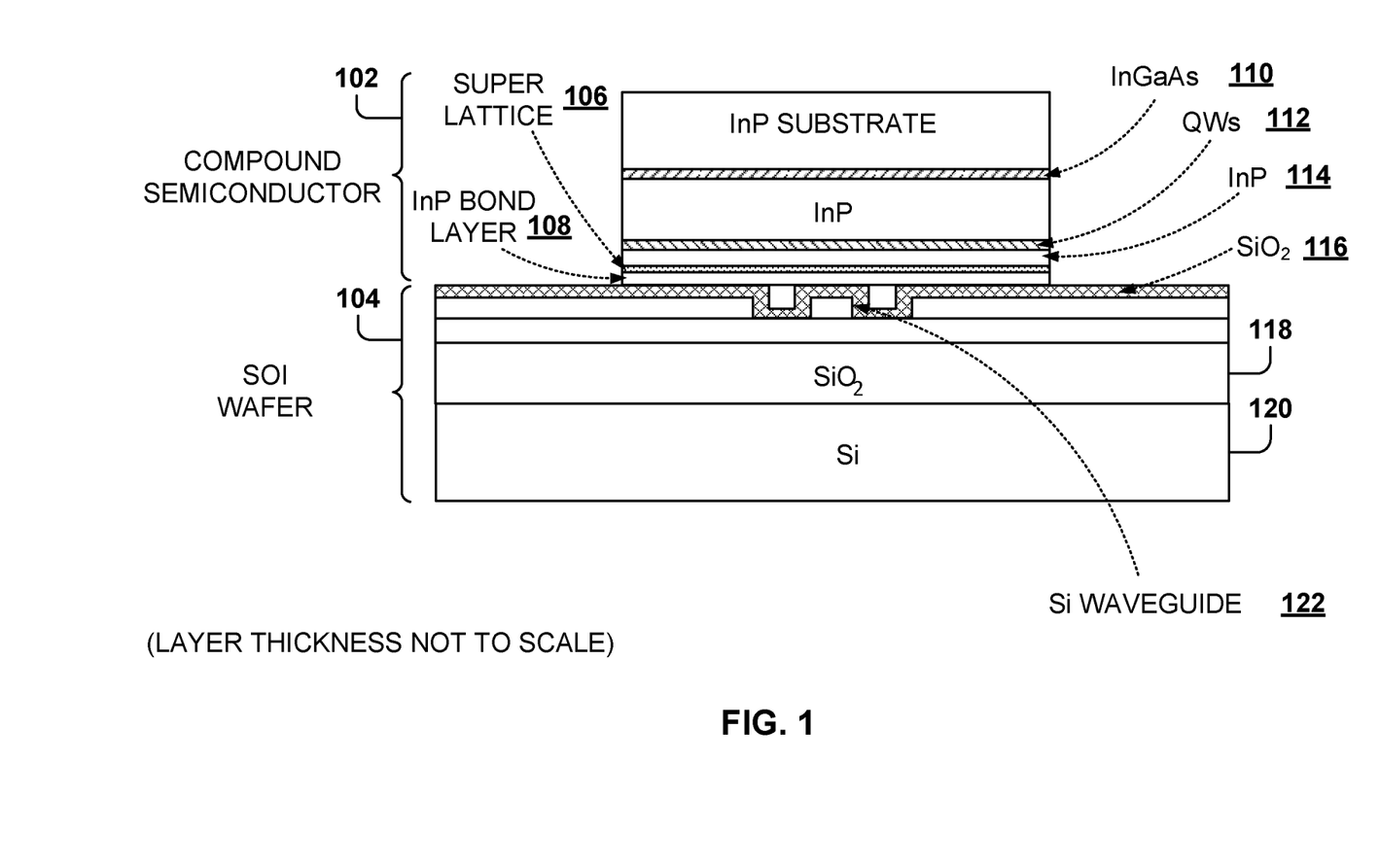
FIG. 1 illustrates the bonding of heterogeneous materials, according to some example embodiments.

FIG. 1 illustrates the bonding of heterogeneous materials, according to some example embodiments. FIG. 1 shows a cross-section of a compound semiconductor 102 and an SOI wafer 104 before being bonded together. The SOI wafer 104, or silicon-on-insulator wafer, is created with a silicon base 120, a layer of $SiO_2$ 118 on top of the silicon base 120, and a silicon waveguide 122 that provides low-loss routing. In addition, a $SiO_2$ bonding layer 116 is added on top of the waveguide 122. The SOI wafer is made by forming and patterning the silicon waveguides, and then the SOI wafer is plasma cleaned. For simplicity of description, other layers and circuits in the SOI wafer are omitted, but a person skilled in the art would readily appreciate that the SOI wafer may include a plurality of circuits and layers.

Further, a compound semiconductor 102 is grown separately. In some example embodiments, the compound semiconductor 102 utilizes III-V type materials, a class of materials which produce efficient lasers, modulators, and detectors.

In some example embodiments, the compound semiconductor 102 includes a base of InP substrate and additional layers are added. In the example embodiment of FIG. 1, the layers include a InGaAs layer 110, another InP layer, a QWs layer 112, another InP layer 114, a super lattice 106, and an InP bond layer 108.

It is noted that a large III-V semiconductor may be formed and then singulated into a plurality of epi dies prior to bonding. The epi dies are referred to herein as the compound semiconductor 102, and the epi dies are bonded to the SOI wafer.

The combination of the compound semiconductor 102 and the SOI wafer 104 is desired because the silicon provides the low-loss waveguide routing and the III-V materials provide efficient light properties. Because they are different types of materials, the compound semiconductor 102 and the SOI wafer 104 are bonded together. Different oxide types of bonding materials may be used to connect the two semiconductors together.

In some example embodiments, the compound semiconductor 102 and the SOI wafer 104 are placed together and then pressure and heat are applied to bond them together. Afterwards, they may be plasma cleaned and further steps may be taken to form circuits on the compound semiconductor 102. That is, at this point, the silicon patterning is done, but the III-V patterning is still in progress. In other bonding approaches, a polymer (e.g., benzocyclobutene, commonly abbreviated as BCB) bond is used, such that the III-V is connected to the silicon using the polymer.

It is noted that the embodiments illustrated in FIG. 1 are examples and do not describe every possible embodiment. Other embodiments may utilize different, additional, or fewer layers on the compound semiconductor 102 and the SOI wafer 104. The embodiments illustrated in FIG. 1 should therefore not be interpreted to be exclusive or limiting, but rather illustrative.

Figure 2:
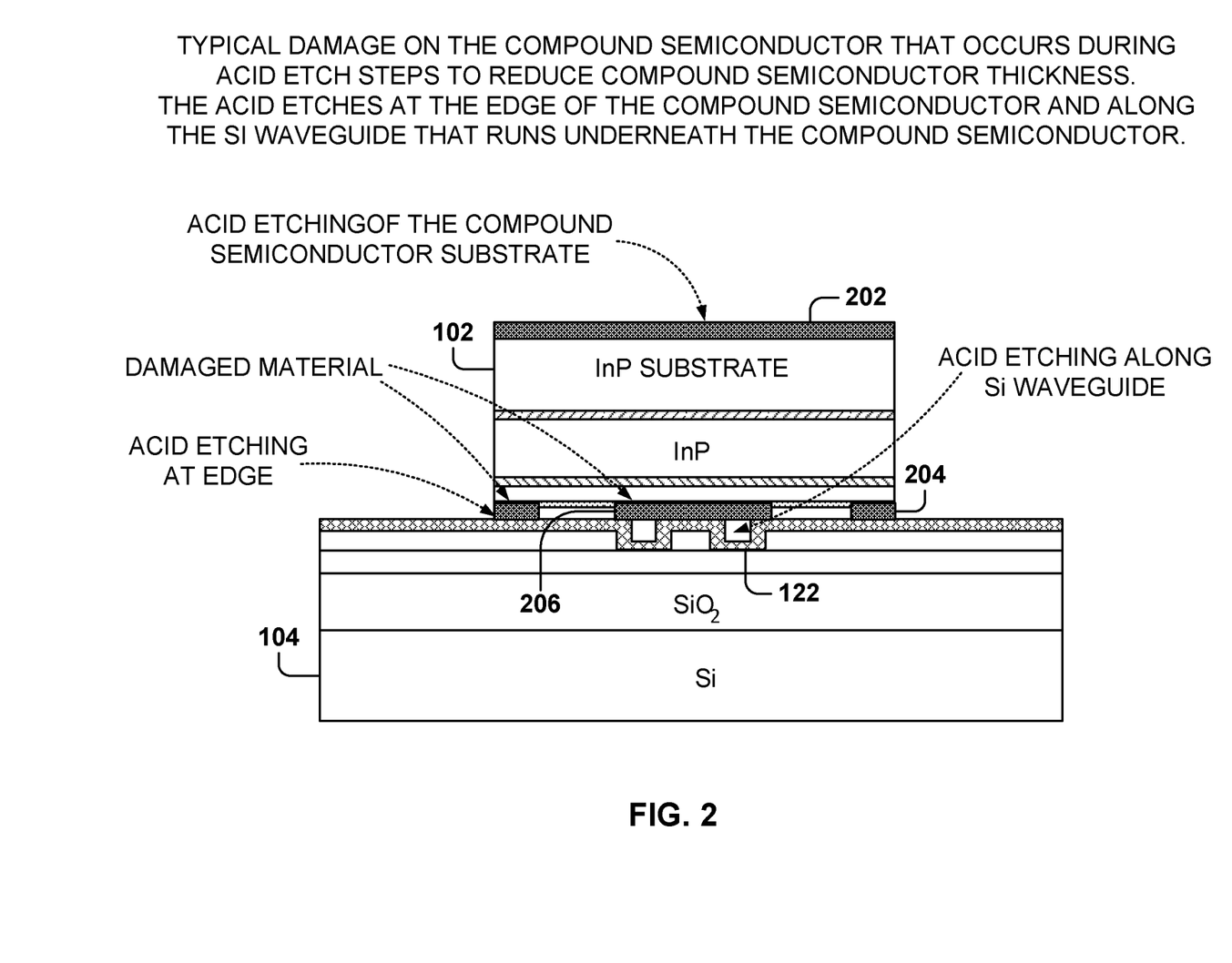
FIG. 2 illustrates the damage to the compound semiconductor due to acid utilized during the processing of the bonded structure, according to some example embodiments.

FIG. 2 illustrates the damage to the compound semiconductor due to acid utilized during the processing of the bonded structure, according to some example embodiments. After the two semiconductors are bonded together, additional processing of the compound semiconductor 102 takes place. Some operations may include using acid to edge the compound semiconductor substrate 202 to reduce compound semiconductor thickness.

However, when using acid, the acid may edge at the bottom 204 of the compound semiconductor 102 or may create damage along the Si waveguide 122. Because there is damage 204 at the edge, the edges have to be removed, which limits how small the semiconductors may be.

Figure 3:
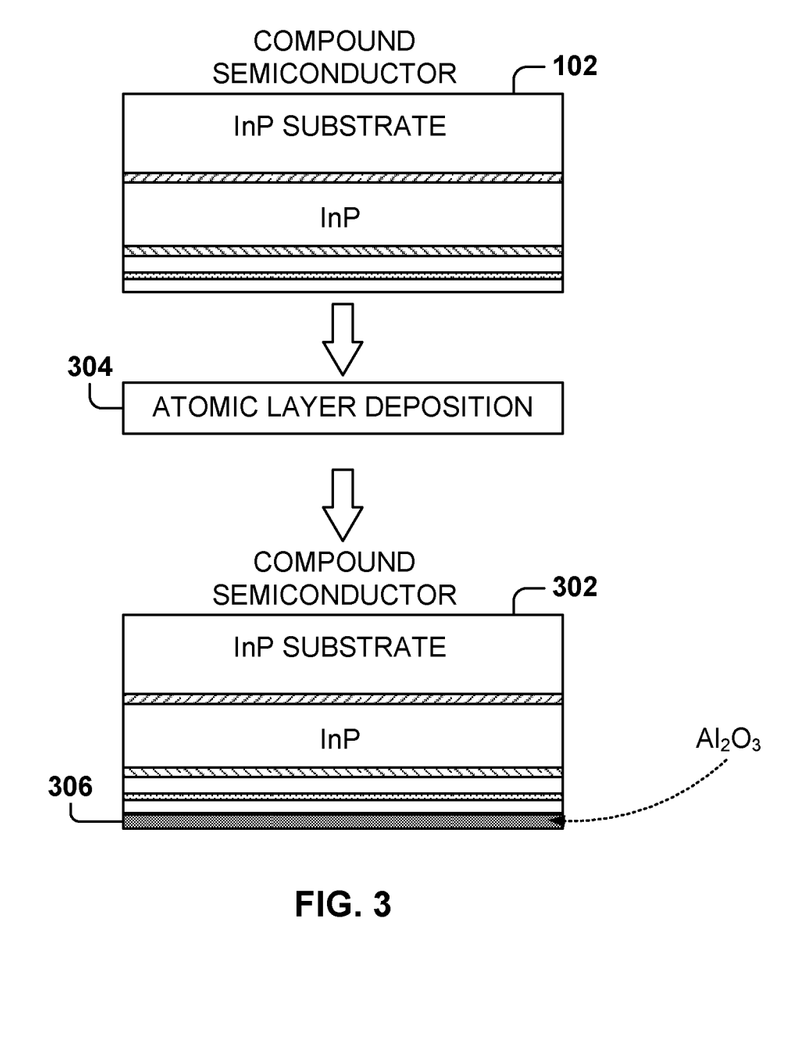
FIG. 3 illustrates the addition of a protection material via atomic layer deposition (ALD), according to some embodiments.

FIG. 3 illustrates the addition of a protection material via ALD 304, according to some embodiments. In some example embodiments, a thin film of protection material 306 is deposited using ALD 304 on the compound semiconductor 102, resulting in compound semiconductor 302 with protection material 306. Atomic layer deposition (ALD) is a thin film deposition technique that is based on the sequential use of a gas phase chemical process. ALD is considered a type of chemical vapor deposition. A majority of ALD reactions use two chemicals, typically called precursors. These precursors react with the surface of a material one at a time in a sequential, self-limiting, manner. Through the repeated exposure to separate precursors, a thin film is slowly deposited.

Embodiments are presented herein by using $Al_2O_3$ as the protection material, but other dielectric materials may be used, such as $SiO_2$, $HfO_2$, $ZrO_2$, SiN, $TiO_2$, or other dielectric films. In addition, ALD is used for describing the present embodiments, but other deposition methods may be used instead, such as plasma enhanced chemical vapor deposition (PECVD), ion beam deposition (IBD), and radio frequency (RF) sputtering.

The height of the deposition layer is in the range of 1 to 50 nanometers, although other values are also possible. In some example embodiments, a 10 nm layer is utilized.

One of the advantages of using ALD is that it improves the shear strength of the bond because, among other reasons, it provides a virtually defect free layer that is better suited for bonding. The ALD films are completely conformal in that there are no breaks in the films and no discontinuities. It is also easy to control the thickness of the film so that the layer may be as small as a single monolayer (approximately a nanometer) and all the way up to tens or hundreds of nanometers. The results from using $Al_2O_3$ deposited with ALD is that the bond quality is greatly improved.

Figure 4:
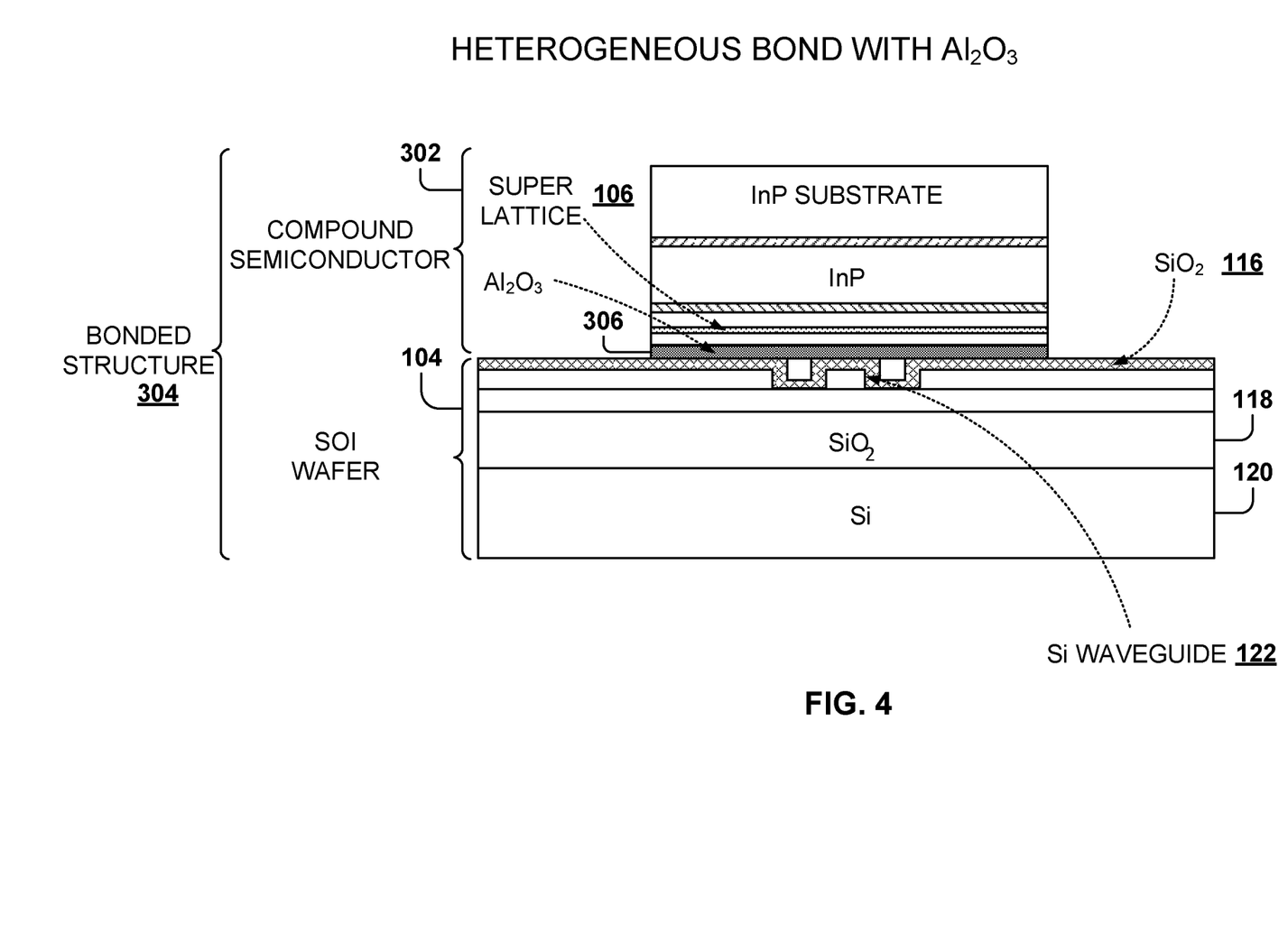
FIG. 4 illustrates the creation of a bonded structure by bonding the compound semiconductor and the SOI wafer, according to some example embodiments.

FIG. 4 illustrates the creation of a bonded structure by bonding the compound semiconductor and the SOI wafer, according to some example embodiments. After the $Al_2O_3$ is deposited, the compound semiconductor 302 and the SOI wafer 104 are bonded together to create a bonded structure 304. For example, the two semiconductors may be bonded together by placing them together and then applying pressure and heat.

The bond forms oxides on the III-V and oxides on the silicon, and the oxides keep the compound semiconductor 302 and the SOI wafer 104 connected.

Figure 5:
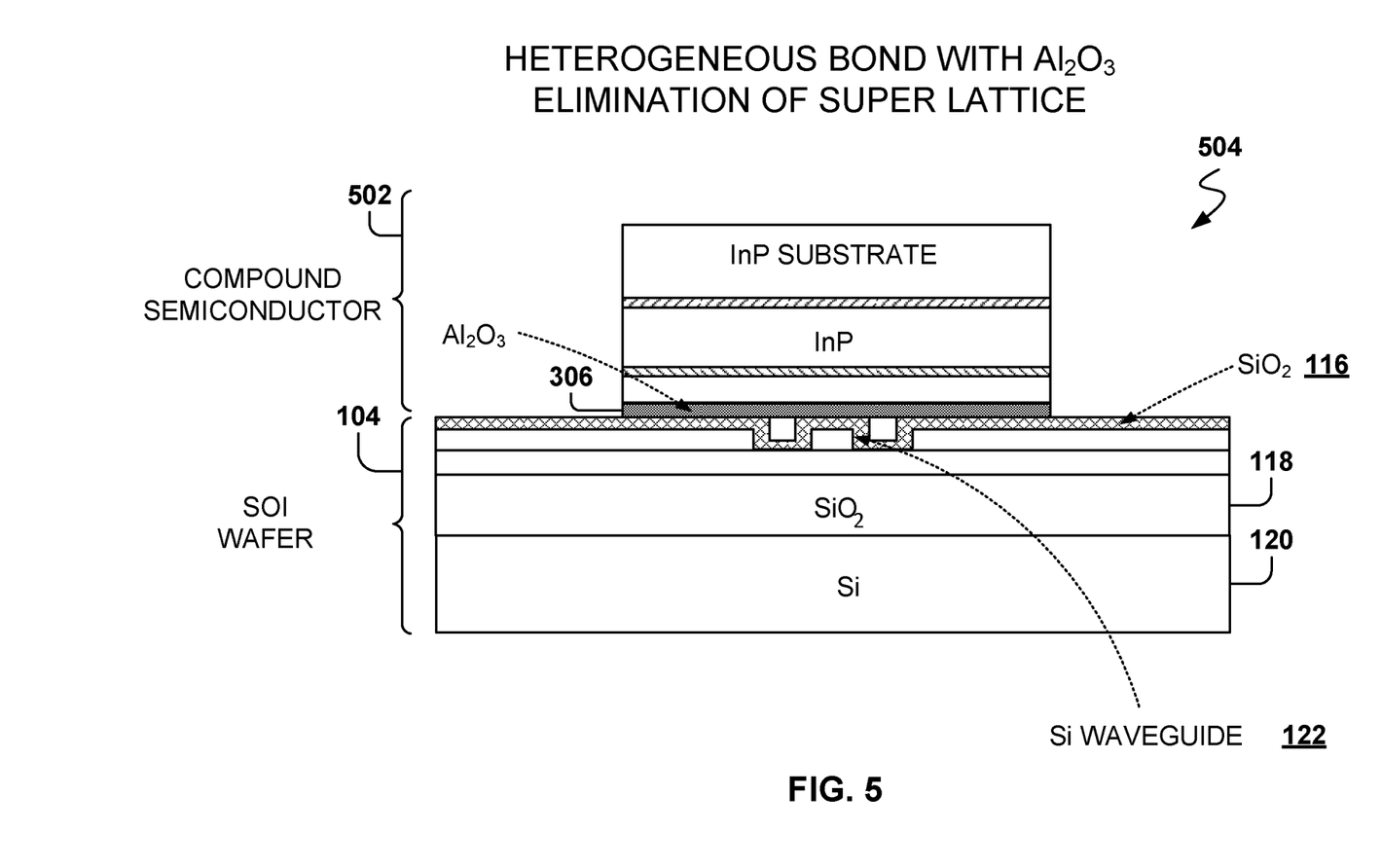
FIG. 5 illustrates a compound structure without a super lattice, according to some example embodiments.

FIG. 5 illustrates a compound structure without the super lattice, according to some example embodiments. A disadvantage of incorporating the $Al_2O_3$ on the compound semiconductor is that the separation of the III-V from the Si waveguide is increased. The optical operations in the PIC need to transfer an optical mode (i.e. light) from one material to the other; therefore, reducing this separation is desirable.

In the photonic integrated circuits, the light is routed around the chip in silicon waveguides, and then the active optical functions, such as lasers, detectors and modulators, take place in the III-V material. Therefore, in an active device, there is a coupling between the silicon and the III-V. The $Al_2O_3$ adds thickness to the gap between the silicon and the III-V, so the performance of the coupling is decreased. The smaller the gap between the silicon and the active layer of the III-V, the better the coupling between the two materials.

In some example embodiments, the solution is to decrease the distance of the optical coupling, such as by eliminating the super lattice in the compound semiconductor 502. A super lattice includes two materials which are grown one after the other in very thin layers. For example, the super lattice layers may be around 10 nm while other layers may be in the tens or hundreds of nanometers. The purpose of the super lattice is to prevent defects from moving from the bottom surface up into the material. The super lattice layer acts as a defect block mechanism and improves the reliability of the device. The removal of the super lattice makes the compound semiconductor at risk from bond defects, yet it also improves coupling performance between the Si and compound semiconductor.

However, the $Al_2O_3$ layer provides similar protection by moving the bond interface away from the compound semiconductor surface, therefore some defect blocking is maintained even after removing the super lattice. Meanwhile, the distance (i.e. optical confinement) from the III-V to the silicon waveguide is reduced improving coupling performance, and the quality of the bonding is also improved. Removing the super lattice is a trade-off, but overall the performance is better with the $Al_2O_3$ layer.

In simulations, the detector responsivity and modulator insertion loss were better with the 10 nm $Al_2O_3$ layer and without the super lattice compared to the compound semiconductor having the super lattice but no $Al_2O_3$ layer.

Figure 6:
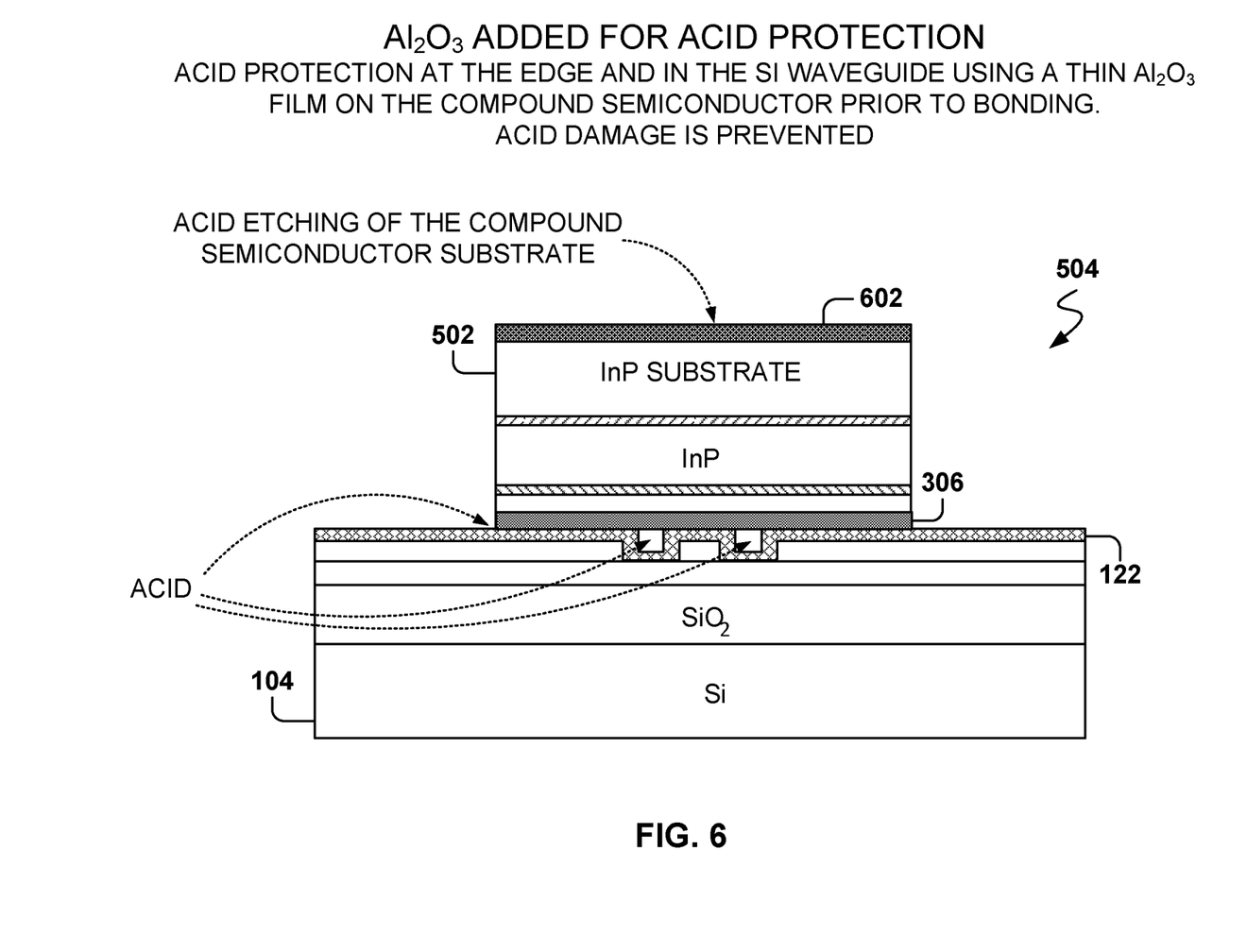
FIG. 6 shows how the $Al_2O_3$ enhanced bonded structure provides better protection during processing, according to some example embodiments.

FIG. 6 shows how the $Al_2O_3$ enhanced bonded structure provides better protection during processing, according to some example embodiments. After adding the $Al_2O_3$ 306 to the compound structure 502, it was observed that the damage from acid utilized during etching 602 operations was greatly reduced. The damage was reduced on the edges of the compound semiconductor as well as along the silicon waveguide.

In some laboratory tests, and cited as an example without meaning to be limiting, the observed damage at the edges with a 10 nm layer of $Al_2O_3$ were practically eliminated. At 2 nm and at 5 nm some damage at the edge was observed, but the damage was less than without using the $Al_2O_3$ layer. Further, the shear strength of the bonding was also improved. More sample results are provided below with reference to FIG. 7.

Figure 7:
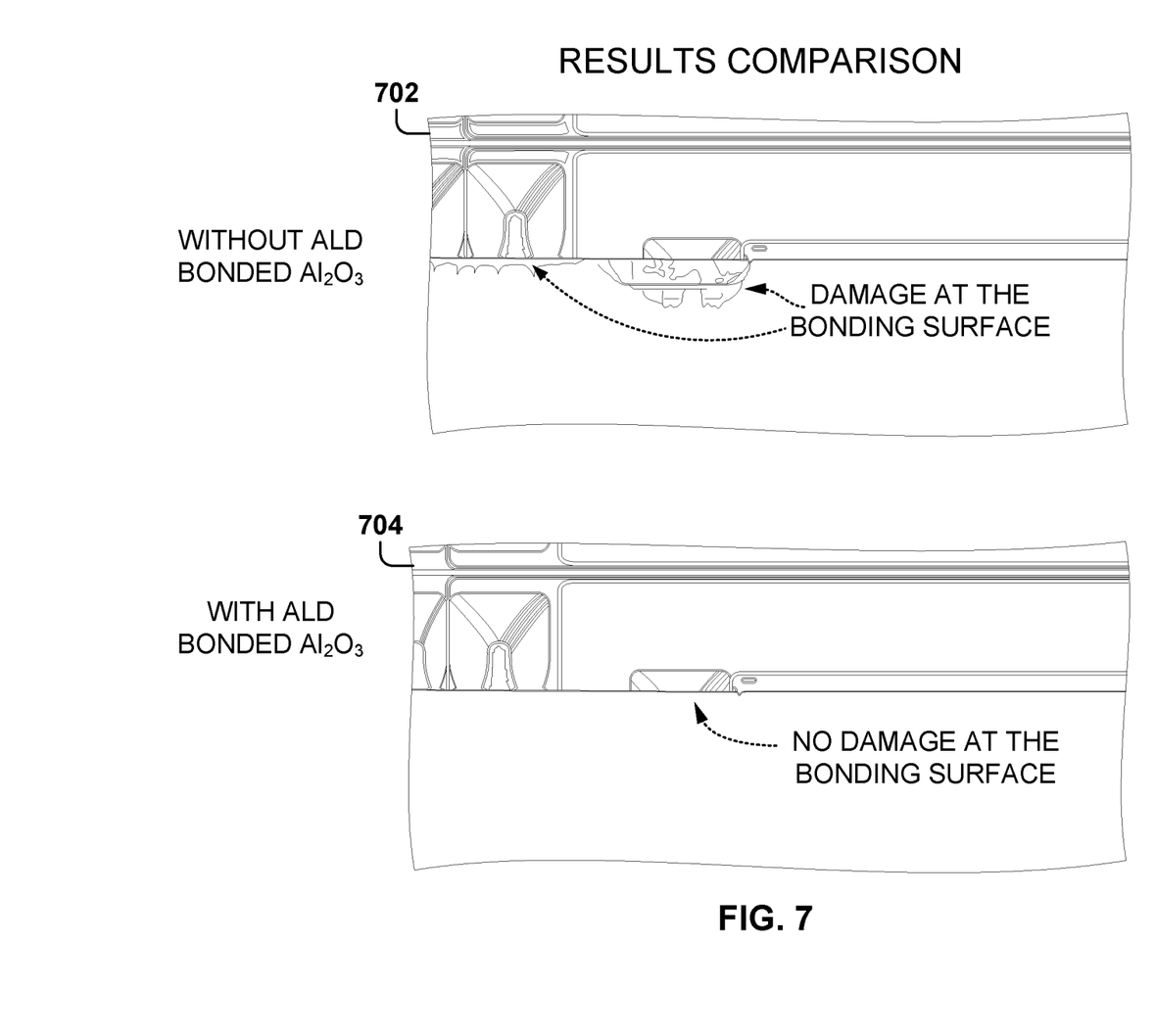
FIG. 7 illustrates some results showing the improvement obtained by utilizing the protection layer, according to some example embodiments.

FIG. 7 illustrates some results showing the improvement obtained by utilizing the protection layer, according to some example embodiments. A few tests were performed for semiconductors with and without $Al_2O_3$ and the damage on the edges of the bond were measured.

Capture 702 illustrates an image taken of a bonded structure without ALD $Al_2O_3$, and capture 704 illustrates an image taken of a bonded structure with ALD $Al_2O_3$ 10 nm thick. Capture 702 shows that there is damage at the edge of the bonding because there is material missing, while the bonded structure with the ALD $Al_2O_3$ shows no observable damage. The edges of the ALD $Al_2O_3$ were continuous and undamaged, and there was no under-etch.

The shear strength was also measured by checking the amount of force needed to separate the bonded structures. In some tests, the shear strength of the ALD $Al_2O_3$ semiconductor was about two and a half times the shear strength of the semiconductor without the $Al_2O_3$.

In other tests, the performance of the detector regarding light responsivity was measured for different semiconductor structures. Since the super lattice had been eliminated from the compound structure, the light responsivity was improved because the $Al_2O_3$ layer was thinner than the super lattice, resulting in a closer light coupling.

Figure 8:
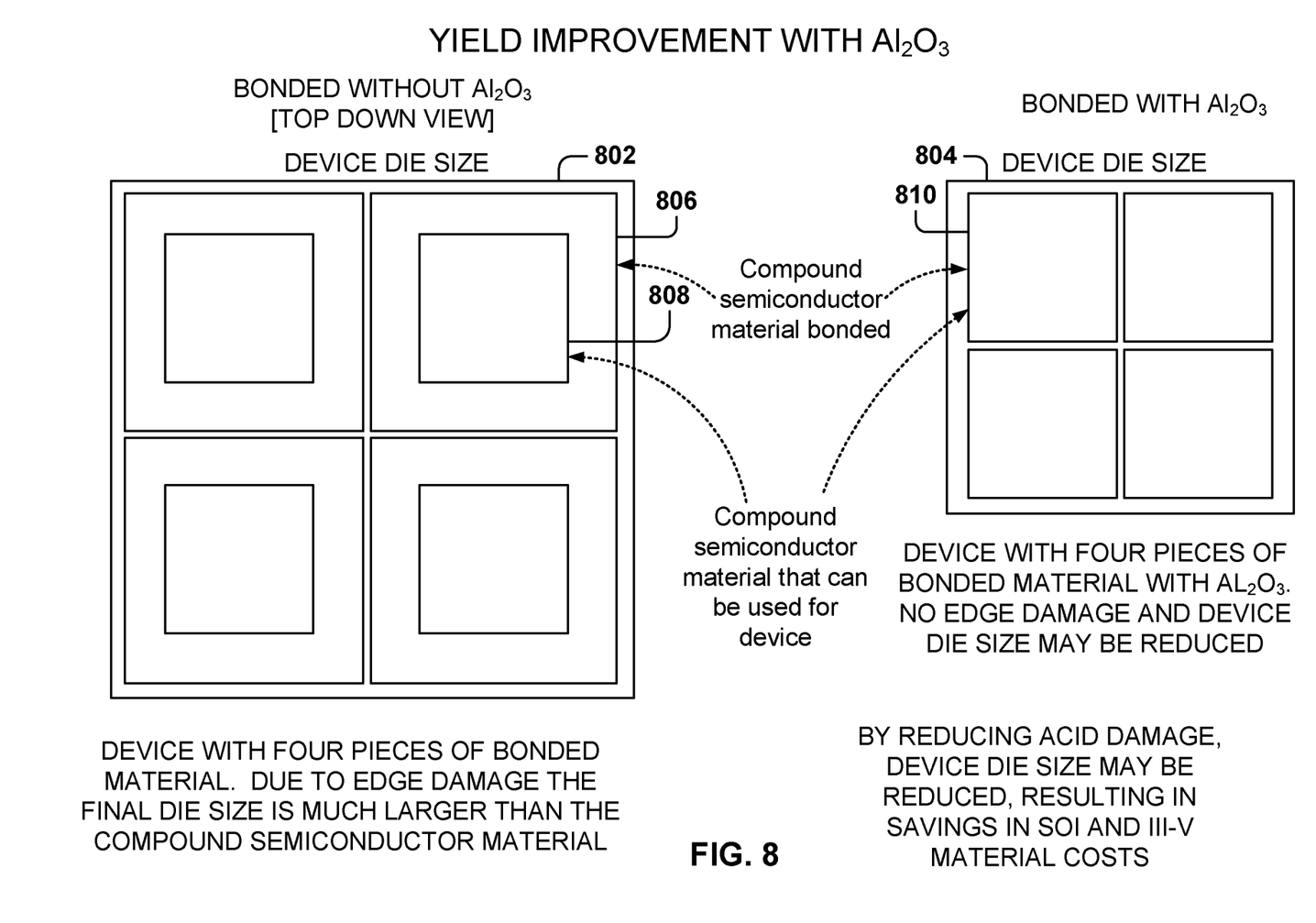
FIG. 8 illustrates the yield improvement gains obtained with the $Al_2O_3$ layer, according to some embodiments.

FIG. 8 illustrates the yield improvement gains obtained with $Al_2O_3$ layer, according to some embodiments. The benefits of the ALD $Al_2O_3$ semiconductor include: (a) reduced, or eliminated, plasma cleaning required on the III-V piece prior to bonding, which allows higher throughput; (b) smaller pieces of III-V may be bonded since the setback from III-V edge to device may be reduced; (c) reduced die size and more die per wafer, since the die size is limited currently by the III-V bond piece size; and (d) greatly reduced III-V surface defect growth after bonding.

Device 802 is a semiconductor circuit bonded without the use of $Al_2O_3$. The device 802 includes four pieces of compound semiconductor 806 bonded on top of the SOI wafer. Because of the damage on the edges of the compound semiconductor 806, only a reduced portion 808 may be used for the final PIC.

Device 804 includes four compound semiconductors 810 bonded on top of the SOI wafer. Because the compound semiconductor 810 is not damaged due to the protection provided by the $Al_2O_3$ layer, the complete compound semiconductor may be utilized for the PIC.

It is also noted that because the compound semiconductors are not damaged, it is possible to place the III-V pieces closer together, which results in smaller PICs and improved III-V usage, resulting in less waste and less cost for the III-V semiconductor. Further, since there is less waste on the III-V semiconductor, there is also less waste on the SOI wafer, resulting in reduced silicon expenses.

In some examples, it is possible to use simpler manufacturing processes because the compound semiconductor is not as sensitive to acid chemicals.

Figure 9:
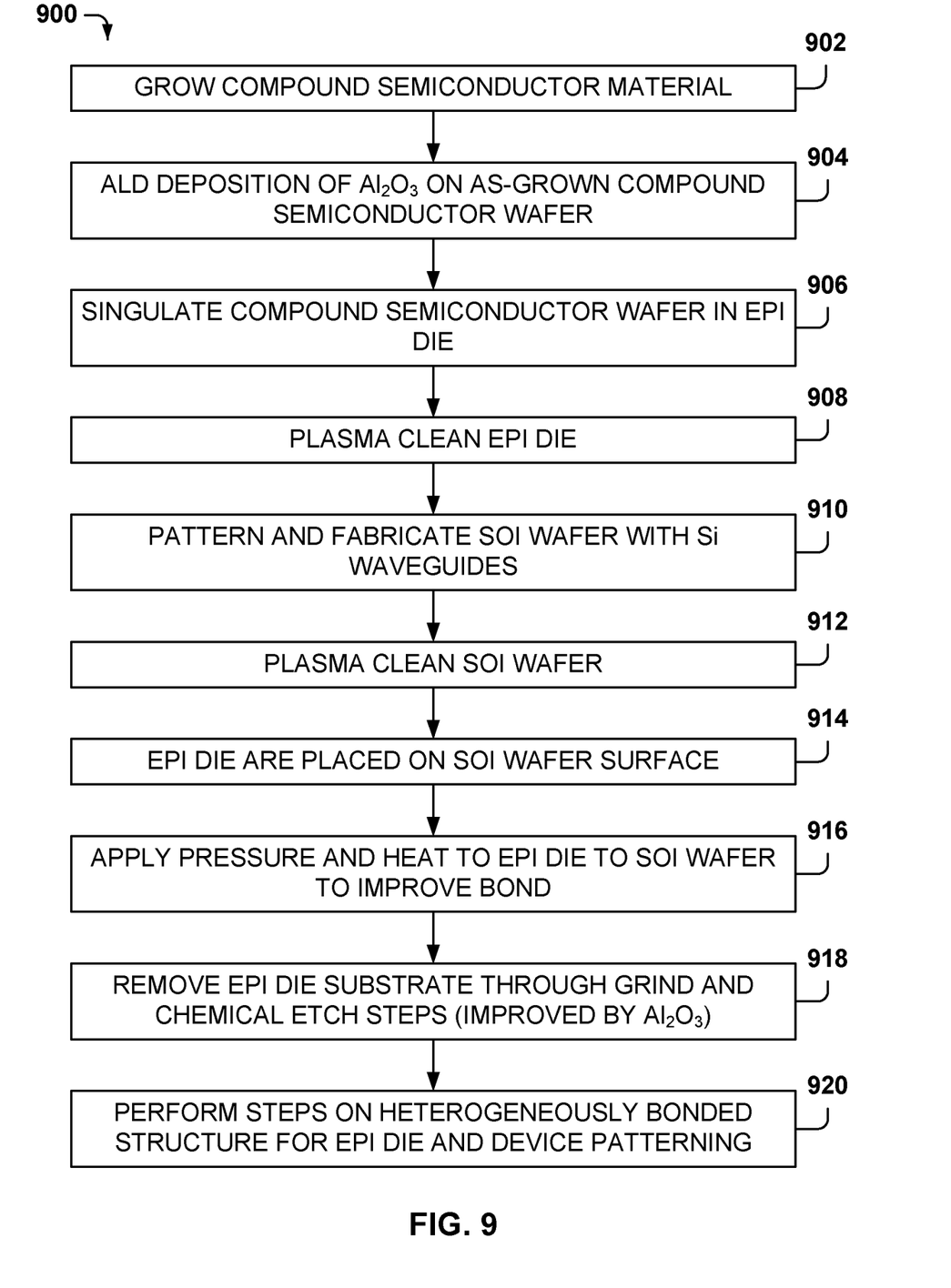
FIG. 9 is a flowchart of a method for heterogeneous integration of photonics and electronics with ALD bonding.

FIG. 9 is a flowchart of a method 900 for heterogeneous integration of photonics and electronics with ALD bonding. At operation 902, the compound semiconductor material is grown, and at operation 904, the protection material is deposited on the compound semiconductor grown in operation 902. In some example embodiments, the deposition is performed utilizing ALD and the protection material is $Al_2O_3$, although other protection materials are also possible.

At operation 906, the III-V wafer is then singulated into small pieces for bonding to the SOI wafer. The epi die are plasma cleaned at operation 908, ensuring that the surface is very clean before bonding.

At operation 910, the SOI wafer is patterned and fabricated, including the silicon waveguides, and the SOI wafer is plasma cleaned at operation 912.

At operation 914, the epi die are placed on the SOI wafer surface, and at operation 916, pressure and heat are applied to the epi die on top of the SOI wafer to improve the bond.

From operation 916, the method flows to operation 918, where the epi die substrate is removed through grinding and chemical etch steps (with the improved performance provided by the protection material layer). At operation 920, additional steps are performed on the heterogeneously bonded structure for epi die and device patterning.

Figure 10:
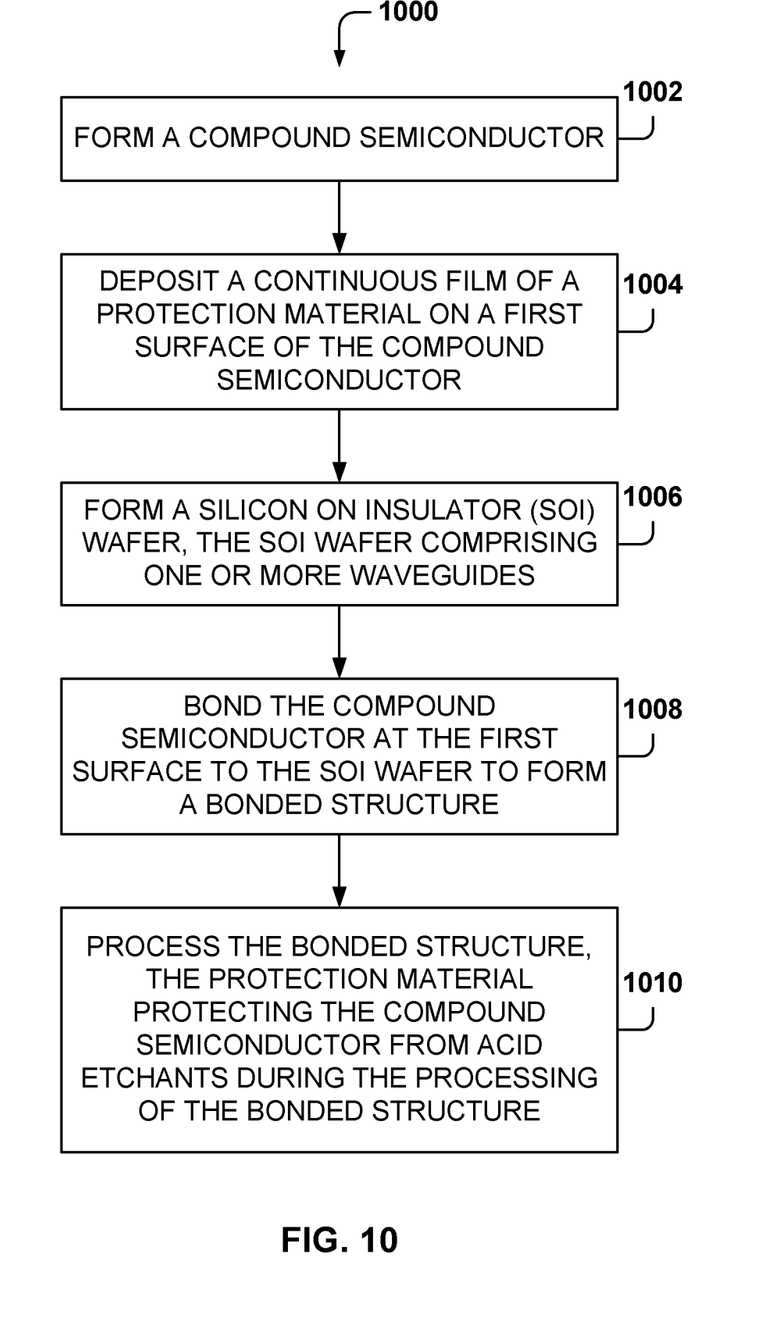
FIG. 10 is a flowchart of a method for making a bonded structure, according to some example embodiments.

FIG. 10 is a flowchart of a method 1000 for making a bonded structure, according to some example embodiments. While the various operations in the flowcharts of FIGS. 9 and 10 are presented and described sequentially, one of ordinary skill will appreciate that some or all of the operations may be executed in a different order, be combined or omitted, or be executed in parallel.

At operation 1002, the compound semiconductor is formed (e.g., compound semiconductor 502 of FIG. 5). From operation 1002, the method flows to operation 1004 where a continuous film of a protection material (e.g., $Al_2O_3$ layer 306 of FIG. 5) is deposited on a first surface of the compound semiconductor.

Further, at operation 1006, a SOI wafer is formed (e.g., SOI wafer 104 of FIG. 5), with the SOI wafer comprising one or more waveguides 122. From operation 1006, the method flows to operation 1008 for bonding the compound semiconductor at the first surface to the SOI wafer to form a bonded structure.

From operation 1008, the method flows to operation 1010 for processing the bonded structure. The protection material protects the compound semiconductor from acid etchants during the processing of the bonded structure.

In one example, depositing the continuous film is performed by atomic layer deposition.

In some examples, the protection material is $Al_2O_3$. In other examples, the protection material is one of $SiO_2$, $HfO_2$, $ZrO_2$, SiN, or $TiO_2$.

In some examples, the continuous film has a height between 2 and 50 nanometers, but other heights of the protection layer are possible, such as in the range from 1 to 100 nanometers.

In some example embodiments, the compound semiconductor is a III-V wafer.

In some example embodiments, bonding the compound semiconductor to the SOI wafer further includes placing the compound semiconductor on the SOI wafer, applying pressure and heat to the compound semiconductor and the SOI wafer, and removing the pressure and heat.

In some examples, the SOI wafer includes a $SiO_2$ layer directly above one of the one or more waveguides, where the $SiO_2$ layer is placed in contact with the first surface of the compound semiconductor for the bonding.

In some examples, the compound semiconductor does not include a super lattice layer to compensate for the increased sized of the compound semiconductor with the continuous film of the protection material.

In some examples, processing the bonded structure further includes removing an epi substrate from the compound semiconductor through grind and chemical steps and device patterning on the compound semiconductor.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A photonic integrated circuit comprising:
    a semiconductor die structure comprising:
        circuit patterns created from one or more acid etchants applied to the photonic integrated circuit; and
        a film of protection material deposited on a side of the semiconductor die structure, the semiconductor die structure being one of a plurality of semiconductor dies separated from a semiconductor wafer, the film of protection material being deposited on the side of the semiconductor wafer; and
    a silicon on insulator (SOI) structure comprising one or more waveguides, the semiconductor die structure bonded to the SOI structure such that the film of protection material on the side of the semiconductor die structure is in contact with another side of the SOI structure,
    wherein the film of protection material protects the semiconductor die structure and protects the another side of the SOI structure from the one or more acid etchants.

2. The photonic integrated circuit of claim 1, wherein the film of protection material is deposited on the side of the semiconductor wafer prior to the semiconductor wafer being separated into the plurality of semiconductor dies.

3. The photonic integrated circuit of claim 1, wherein the film of protection material is a dielectric material deposited on the side of the semiconductor wafer.

4. The photonic integrated circuit of claim 3, wherein an additional dielectric material is on the another side of the SOI structure.

5. The photonic integrated circuit of claim 4, wherein the dielectric material and the additional dielectric material are different types of dielectric oxide materials.

6. The photonic integrated circuit of claim 4, wherein the dielectric material is aluminum oxide.

7. The photonic integrated circuit of claim 6, wherein the additional dielectric material is silicon oxide.

8. The photonic integrated circuit of claim 1, wherein the plurality of semiconductor dies and the SOI structure are plasma cleaned.

9. The photonic integrated circuit of claim 8, wherein the plurality of semiconductor dies and the SOI structure are plasma cleaned before placement of the plurality of semiconductor dies on the SOI structure.

10. The photonic integrated circuit of claim 1, wherein the one or more waveguides in the SOI structure are formed before the plurality of semiconductor dies are placed on the SOI structure.

11. The photonic integrated circuit of claim 1, wherein a substrate of the semiconductor wafer is removed using grinding.

12. The photonic integrated circuit of claim 1, wherein a substrate of the semiconductor wafer is removed using one or more chemicals.

13. The photonic integrated circuit of claim 1, wherein forming the photonic integrated circuit comprises applying heat.

14. The photonic integrated circuit of claim 13, wherein the heat is applied to one or more of the plurality of dies.

15. The photonic integrated circuit of claim 1, wherein the film is a vapor deposited film.

16. The photonic integrated circuit of claim 15, wherein the vapor deposited film is a continuous film with no discontinuities.

17. A method for manufacturing a photonic integrated circuit comprising: depositing a film of protection material on a side of a semiconductor die structure, the semiconductor die structure being one of a plurality of semiconductor dies separated from a semiconductor wafer, the film of protection material being deposited on the side of the semiconductor wafer; and bonding the semiconductor die structure to a silicon on insulator (SOI) structure comprising one or more waveguides, the semiconductor die structure bonded to the SOI structure such that the film of protection material on the side of the semiconductor die structure is in contact with another side of the SOI structure.

18. The photonic integrated circuit of claim 1, wherein the film has a height between 2 and 50 nanometers.

19. The photonic integrated circuit of claim 18, wherein the film has a height of 10 nanometers.

20. The photonic integrated circuit of claim 3, wherein the film of protection material includes at least one of: a hafnium oxide, a zirconium oxide, a silicon nitride, or a titanium oxide.

21. The photonic integrated circuit of claim 15, wherein the film is deposited by atomic layer deposition, plasma enhanced chemical vapor deposition, ion beam deposition, or radio frequency sputtering.

* * * * *